(12) United States Patent  
Johnson

(10) Patent No.: US 6,504,395 B1
(45) Date of Patent: Jan. 7, 2003

(54) METHOD AND APPARATUS FOR CALIBRATION AND VALIDATION OF HIGH PERFORMANCE DUT POWER SUPPLIES

(75) Inventor: Gerald H. Johnson, Andover, MN (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/943,275

(22) Filed: Aug. 30, 2001

(51) Int. Cl.[7] ............................................. G01R 31/26
(52) U.S. Cl. ..................... 324/765; 324/763; 324/771
(58) Field of Search ................................. 323/273, 275, 323/282; 324/763, 765, 771, 158.1

(56) References Cited

U.S. PATENT DOCUMENTS

| | | | | |
|---|---|---|---|---|
| 5,773,990 A | * | 6/1998 | Wilstrup | 324/765 |
| 5,917,331 A | * | 6/1999 | Persons | 324/765 |
| 6,087,843 A | * | 7/2000 | Pun et al. | 324/765 |
| 6,329,831 B1 | * | 12/2001 | Bui et al. | 324/765 |
| 6,339,338 B1 | * | 1/2002 | Eldridge et al. | 324/765 |

\* cited by examiner

Primary Examiner—Matthew Nguyen
(74) Attorney, Agent, or Firm—Lance Krelsman

(57) ABSTRACT

A power supply circuit is disclosed for use with a semiconductor tester to power a device-under-test. The power supply includes power generation circuitry disposed in the tester to generate power for the device-under-test. Load circuitry is disposed within the tester and coupled to the power generation circuitry to selectively simulate the electrical loading of a device-under-test on the power supply.

17 Claims, 4 Drawing Sheets

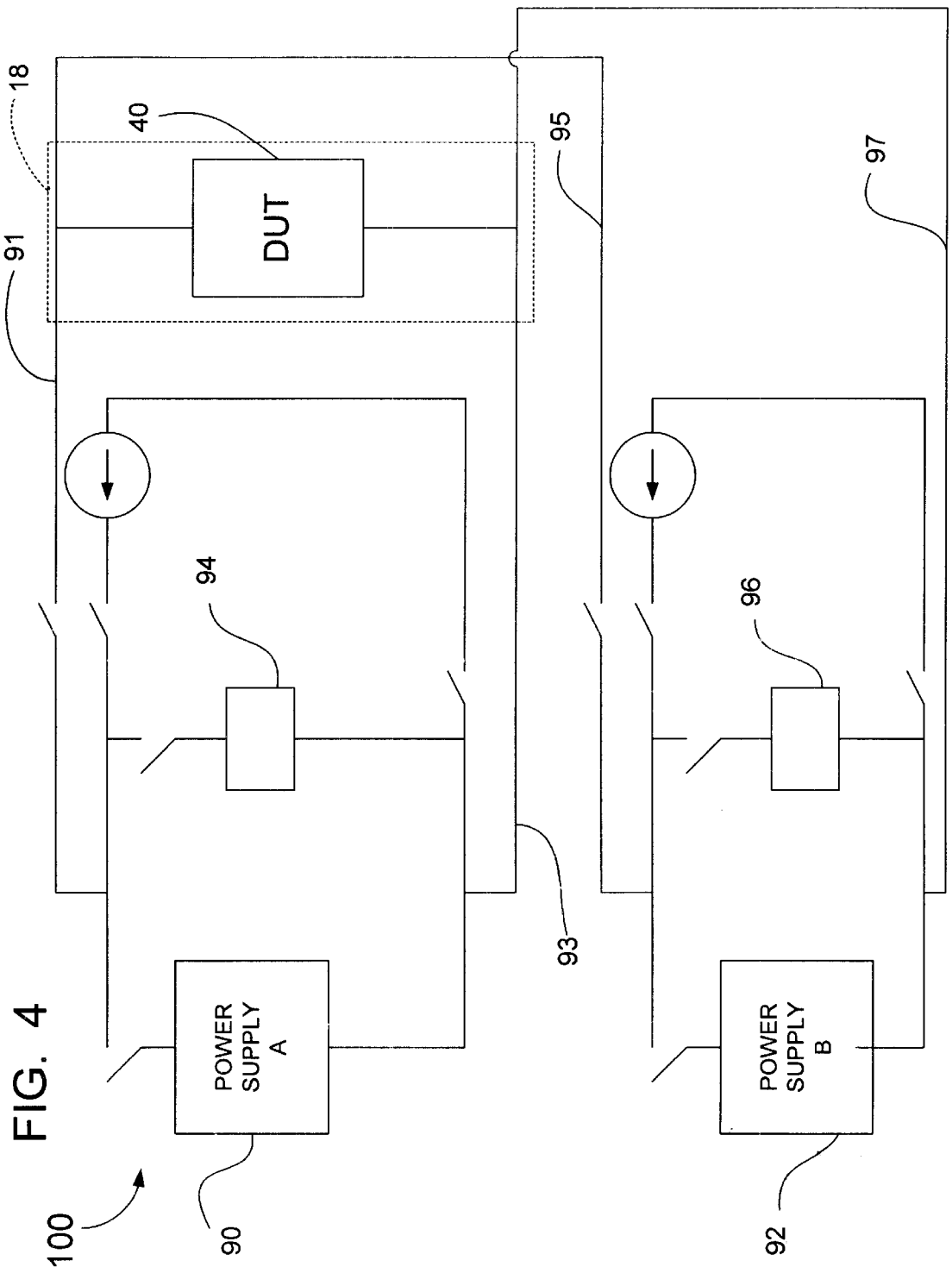

METHOD AND APPARATUS FOR CALIBRATION AND VALIDATION OF HIGH PERFORMANCE DUT POWER SUPPLIES

FIELD OF THE INVENTION

The invention relates generally to automatic test equipment and more particularly a high speed and high accuracy power supply for use with a semiconductor tester to provide precise voltage levels to a high-speed device-under-test (DUT).

BACKGROUND OF THE INVENTION

Semiconductor device manufacturing typically includes test processes at both the wafer and packaged-device levels. The testing is normally carried out by automatic test equipment (ATE) that simulates a variety of operating conditions to verify the functionality of each device. As is well known in the art, semiconductor devices generally require a source of power in order to function.

One function that the ATE often performs involves supplying power to the devices-under-test (DUTs). This is typically carried out by a DUT power supply mounted in the tester. The power supply also performs the dual function of measuring the power it supplies to the DUT. This includes current measurements under a variety of conditions. Consequently, to maintain precision and accuracy over time, the power supply typically undergoes periodic calibration.

Conventionally, calibrating the current measurement circuitry for a DUT power supply involves the use of external National Institute for Standards Traceability (NIST) components to establish the calibration gain and offset values. The standards typically comprise known precision resistors mounted to a customized calibration device-interface-board (DIB). A calibration DIB is not part of the tester, but rather a board assembly for a device handler (or prober) that couples to the tester. The power supply current is driven through the custom DIB resistors and the voltage across the resistors measured by a NIST compliant voltmeter. The current value calculated from the measured voltage and the measured resistors is then compared with the current value determined by the current measurement circuitry internal to the power supply. The differences are identified and calibration terms generated to compensate for the detected differences.

While this method generally works well for its intended applications, the use of the customized calibration DIB in order to calibrate the power supply current measurement circuitry usually involves "undocking" the tester from the DUT handler or prober, to effect the removal and subsequent replacement of the production device DIB. This can be a time-consuming process and often causes lost productivity in a manufacturing test environment.

In addition to requiring periodic calibration, a DUT power supply often undergoes validation procedures to ensure acceptable dynamic operation prior to engaging in production device testing. Validation generally involves steps to confirm that the power supply generates the requisite current, performs as expected under a wide range of dynamic conditions, and maintains stability. Similar to the calibration procedures described above, conventional validation procedures typically employ the use of a customized DIB. For the reasons explained with respect to custom calibration DIBs, undocking the tester to utilize a custom validation DIB is equally undesirable.

What is needed and heretofore unavailable is a high-accuracy DUT power supply capable of addressing the calibration and validation problems without the need to undock the tester. The DUT power supply of the present invention satisfies this need.

SUMMARY OF THE INVENTION

The DUT power supply of the present invention provides a way to conveniently and cost-effectively calibrate and validate a DUT power supply without undocking the tester from the device-under-test handler or prober. This minimizes tester down-time, correspondingly maximizing device throughput for semiconductor manufacturers.

To realize the foregoing advantages, the invention in one form comprises a power supply for use with a semiconductor tester to power a device-under-test. The power supply includes a housing and power circuitry disposed within the housing to generate power for the device-under-test. Internal load circuitry is disposed within the housing and coupled to the power circuitry to selectively simulate the electrical loading of a device-under-test on the power supply.

In another form, the invention comprises automatic test equipment for testing a device-under-test. The automatic test equipment includes a computer workstation and a test head coupled to the computer workstation. The test equipment further includes a device-under-test power supply including a housing and power circuitry disposed within the housing to generate power for the device-under-test. Internal load circuitry is disposed within the housing and coupled to the power circuitry to selectively simulate the electrical loading of a device-under-test on the power supply.

In yet another form the invention comprises a method of calibrating an ATE power supply current measurement unit without undocking a semiconductor tester from a device handling apparatus. The method includes the steps of selecting an in-tester load having a known impedance; substituting the device-under-test with the in-tester load, such that the ATE power supply current measurement unit is coupled to the in-tester load; measuring a first current with the current measurement unit; determining a second current by detecting the voltage across the in-tester load, and dividing the voltage value by the known impedance; comparing the first current to the second current to calculate an offset current; and assigning calibration values to compensate for the calculated offset current.

A further form of the invention comprises a method of validating a DUT power supply without undocking a semiconductor tester from a device handling apparatus. The method includes the steps of selecting a dynamic in-tester load having variable dynamic load characteristics; substituting the device-under-test with the in-tester load, such that the DUT power supply is coupled to the in-tester load; driving the dynamic in-tester load with the DUT power supply; and confirming that the DUT power supply operated within predetermined performance parameters during the driving step.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which

FIG. 4 is a block diagram of a DUT power supply according to a second embodiment of the present invention.

DETAILED DESCRIPTION OF THE INVENTION

Figure 1:
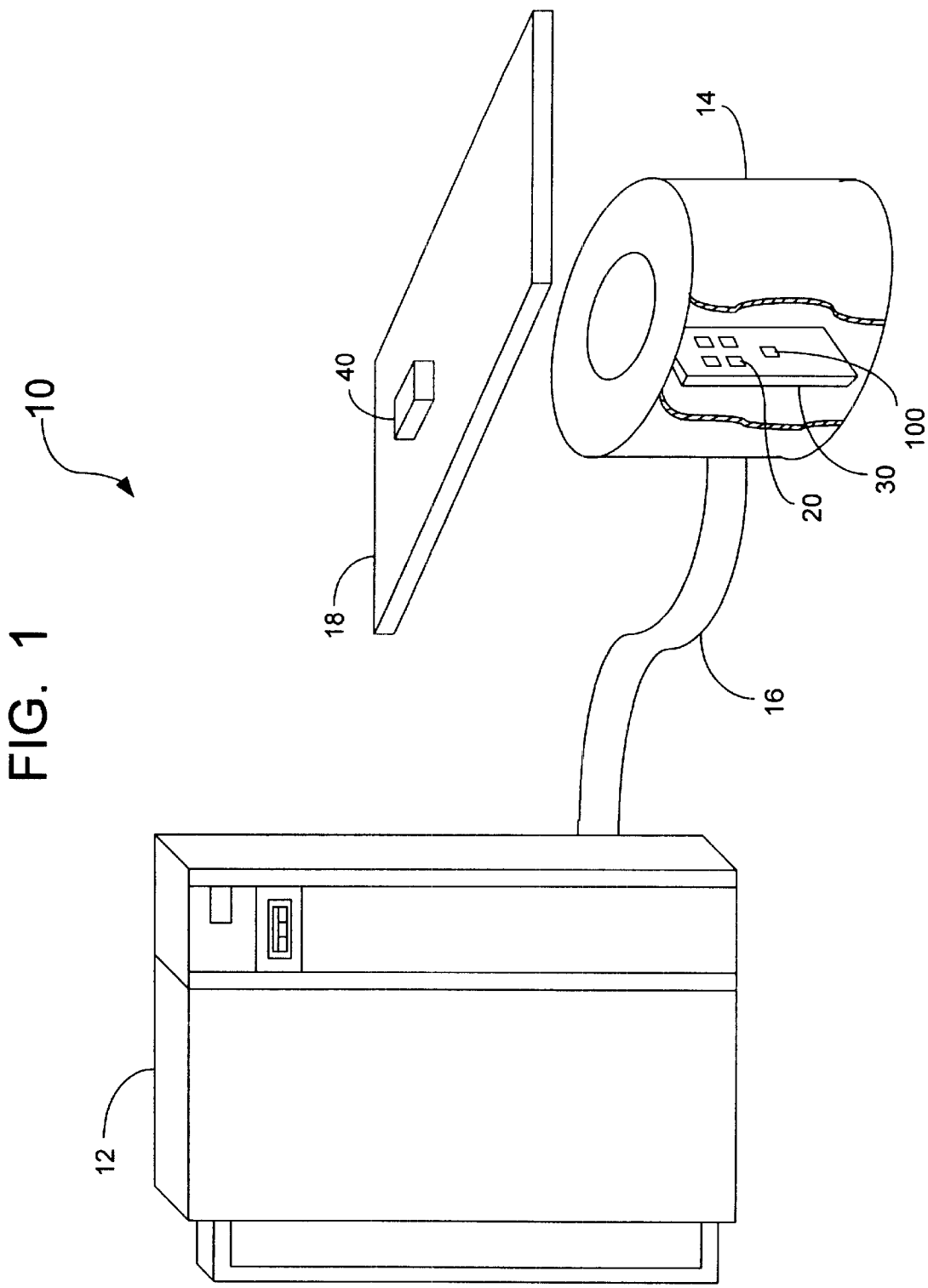
FIG. 1 is a block diagram of a semiconductor tester according to one form of the present invention.

Referring now to FIG. 1, the device-under-test (DUT) power supply of the present invention, generally designated 30, is adaptable for use by automatic test equipment, generally designated 10. The power supply implements on-tester load circuitry 36 (FIGS. 2 and 3) to minimize calibration and validation process times.

By providing on-tester load circuitry available to the DUT power supply, costly hardware modifications for calibration/validation procedures are avoided.

Further referring to FIG. 1, the automatic test equipment, or ATE 10, generally includes a computer workstation 12 that couples to a test head 14 via a cable bundle 16. The test head houses a plurality of channel cards (not shown) and power supply boards 30 (only one board shown) in relative close proximity to the DUT 40. The DUT mounts to a production device-interface-board (DIB) 18, that interfaces with the test head via a tester interface (not shown). The tester interface provides an interconnection of signal, ground and power paths between the ATE and the DUT.

Figure 2:
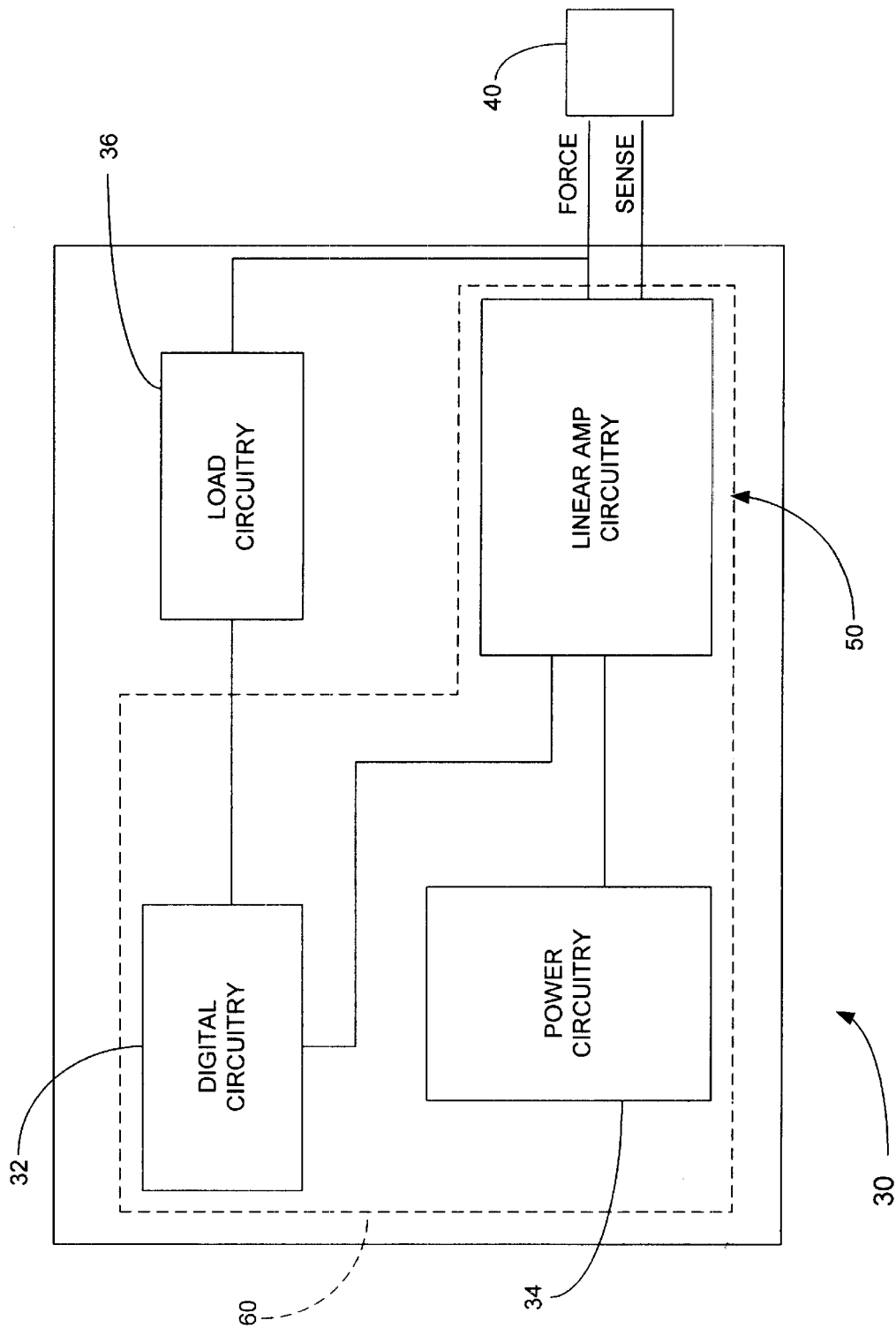
FIG. 2 is a block diagram of a DUT power supply according to one form of the present invention.

With reference to FIG. 2, one specific embodiment of the DUT power supply 30 that employs the internal calibration/validation circuitry of the present invention includes digital circuitry 32, power circuitry 34, internal load circuitry 36 and amplifier circuitry 50. The digital circuitry 32 provides a digital-to-analog control interface between the tester and the DUT power supply. The power circuitry 34, in one embodiment, takes the form of a low-noise switching DC-DC converter, as more fully set forth in co-pending U.S. application Ser. No. 09/718,780, titled Switching DC-DC Converter with Noise Suppression Circuitry, filed Nov. 22, 2000, assigned to the assignee of the present invention, and expressly incorporated herein by reference. Further details of the amplifier circuitry 50 are found in co-pending U.S. patent application Ser. No. 09/797,511, titled "High Current and High Accuracy Linear Amplifier", filed Mar. 1, 2001, assigned to the assignee of the present invention, and expressly incorporated herein by reference.

Figure 3:
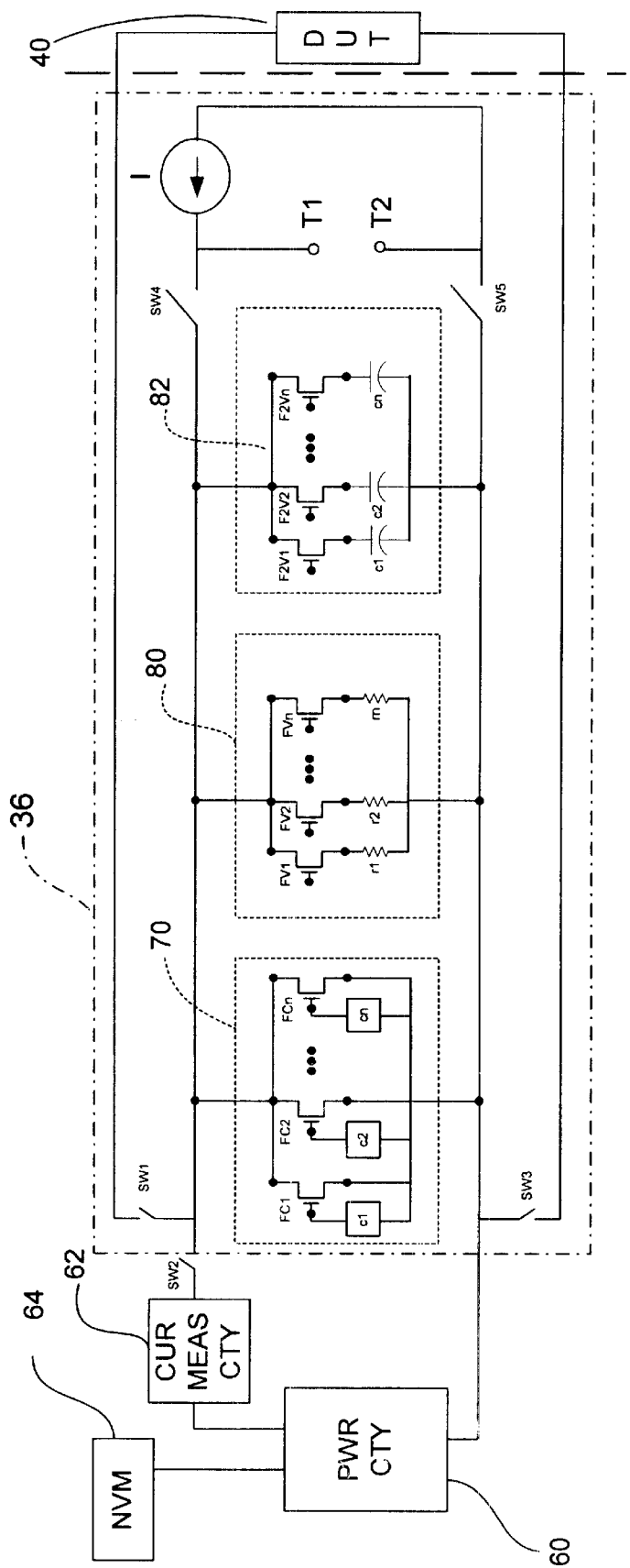
FIG. 3 is a block diagram of the calibration and validation circuitry employed in the load board of FIG. 2.

Referring to FIGS. 2 and 3, the digital circuitry 32, power circuitry 34 and amplifier circuitry 50 of FIG. 2 may be thought of collectively as one embodiment of a power generation circuit 60 (in phantom) for purposes of the present invention. With continued reference to FIG. 3, coupled to the power generation circuit is a current measurement unit 62 for providing accurate and precise current output information to the power circuitry to effect proper regulation under varying loads and operating conditions.

Further referring to FIG. 3, the on-tester load circuitry 36 preferably includes internal calibration circuitry in the form of an active load 70, and internal validation circuitry comprising an AC load 80 and a capacitive load 82. In one embodiment, the active load includes a plurality of FET transistors FC1–FCN coupled in parallel. Each transistor is regulated by a control circuit C1–Cn to maintain consistent and stable operation through varying temperatures and other parameters. Switching circuitry in the form of a plurality of switches SW1–SW5 selectively substitutes the DUT 40 for the active load 70 across the power circuitry output in response to software-driver commands. In a preferred embodiment, the active load 70, the AC load 80 and the capacitive load 82 are coupled to a NIST-traceable current source I.

To calibrate the power supply current measurement unit 62, the active load 70 is first calibrated using the NIST-traceable current source I. The precise value of the current source is stored in a non-volatile RAM memory 64. The precise known current value, for example 1.000 amperes, is applied to each FET of the active load in sequence. Voltage measurements are taken, for example at the terminals T1 and T2 (by NIST traceable voltage measuring circuitry, not shown) and combined with the known current in accordance with Ohms Law to determine the precise resistance value for each FET transistor.

Once the active load resistances for FETs FC1–FCN are known, they may then be activated individually, or in combination, as calibration loads for the current measurement unit 62. For any given known load, voltage measurements may be taken (again, using voltage measurement circuitry, not shown) to determine the output current (using basic Ohms law). This measurement is taken in addition to the readings from the current measurement unit itself. The measured current values are then compared. Calibration offsets and gain factors are then calculated, and stored in a calibration memory (not shown) for future current measurements made by the power supply circuitry during normal device testing.

This combination of circuitry and process achieves a NIST-traceable calibration of the power supply current measurement unit 62 without having to undock the tester (or test head) from a prober or a handler during its normal operating conditions.

With continued reference to FIG. 3, the AC load 80 and the capacitive load 82 emulate the dynamic load currents presented to the power supply by the activity of the DUT and the bulk capacitance usually present on the DIB to minimize voltage droop by supplying instantaneous current to the DUT. By switching different numbers of load FET switches on and off in a dynamic fashion, the varying load of the DUT can be emulated. By switching different numbers of capacitors on, the ability of the power supply to drive the different load capacitances is verified. Validation procedures are highly desirable prior to placing the tester in a production environment.

The AC load 80 preferably comprises a set of dynamic loads including resistors R1–Rn to set current levels and FETs FV1–FVN that are selectively activated to provide a path from the power supply to the load resistors. By implementing several resistors/FETs in parallel, the current level may be varied. Similarly, the capacitive load 82 includes a plurality of FETs F2V1–F2VN that selectively switch-in respective capacitors C1–CN. Use of these two circuits in combination allows the load to emulate a wide range of DUT and DIB test conditions, with a wide range of currents and load impedances.

One of the challenging aspects with having the load circuitry 36 within the ATE test head, as described above, is that unlike external DIB-based validation schemes, the actual interface parasitics to a DIB are not in the validation load path. As a result, the performance of the ATE supply when driving a load through the in-tester parasitics may not be fully validated. Further, the quality of the path from the ATE power supply to the DUT may not be verified fully. The inventor has addressed these potential challenges with a unique modification as described below.

Referring now to FIG. 4, the challenges above are alleviated by providing an ATE power supply 100 comprising two power supply units, power supply A 90 and power supply B 92. The supplies may be operated individually or in parallel. Respective internal loads 94 and 96 are provided for each supply. The loads are similar in construction to the selectively switched AC and capacitive loads described earlier, and warrant no further description.

With continued reference to FIG. 4, both supplies are interconnected to the DUT 40 via separate paths 91, 93 (for power supply A 90) and 95, 97 (for power supply B 92). The connections allow driving the paths to the DIB 18 from one power supply (for example, power supply A) and connecting the load 96 associated with the other supply (power supply B) to that supply's path to the DIB. At that point, the path from the overall combined power supply to the load includes the parasitics from the first supply to the DIB and also the parasitics from the DIB back to the load associated with the second power supply. Thus, the interconnection parasitics and the ability of the power supply to properly supply power through those parasitics may be verified.

Following calibration and validation, the calibration and validation loads 70, 80 and 82 (FIG. 3) are deactivated by the switching circuitry SWa–SWe, and the DUT 40 switched into the power supply circuit. At this point, the power supply is ready for device testing, where accurate current measurement capability is critically important.

Those skilled in the art will appreciate the numerous benefits and advantages afforded by the present invention. Of particular importance is the in-tester load circuitry that enables the elimination of any undocking procedures associated with the calibration and validation process. By eliminating the undocking steps, substantial savings in throughput and time associated with calibration and validation are realized by the semiconductor device manufacturer.

While the invention has been particularly shown and described with reference to the preferred embodiments thereof, it will be understood by those skilled in the art that various changes in form and detail may be made therein without departing from the spirit and scope of the invention. For example, while the present invention has been described in detail for use in packaged-device level applications, minor modifications could be made to employ the power supply in wafer-probe applications. In such applications, device boards take the form of probecards. Moreover, implementation of FET transistors are specifically identified for use in the in-tester load circuits of the present invention. While FETs are preferred, it is to be understood that any type of in-tester loads are within the scope of the present invention, including discrete resistors and other forms of transistor technologies.

Additionally, the description herein often refers to "in-tester" as being within the testhead. While this is considered within the scope of the present invention, the "in-tester loads" may be placed anywhere in the tester, including the mainframe and/or the power supply housing.

What is claimed is:

1. A power supply circuit for use with a semiconductor tester to power a device-under-test, the power supply circuit including:
   power generation circuitry disposed in the tester and having an output to generate power for the device-under-test; and
   load circuitry selectively coupled to the power generation circuitry output and disposed within the tester to selectively simulate the electrical loading of a device-under-test on the power supply.

2. A power supply circuit according to claim 1 wherein the load circuitry comprises calibration circuitry.

3. A power supply circuit according to claim 2 wherein the internal calibration circuitry includes:
   an active DC load.

4. A power supply circuit according to claim 3 wherein the active DC load includes:
   a plurality of FETs disposed in parallel to selectively cooperate and provide a variable resistance.

5. A power supply circuit according to claim 3 and further including:
   a NIST-traceable current source selectively coupled to the active DC load.

6. A power supply circuit according to claim 1 and further including:
   a power supply housing; and
   the power generation circuitry, and the load circuitry and the switching circuitry are disposed within the power supply housing.

7. A power supply circuit according to claim 1 wherein:
   the power generation circuitry comprises first and second power supply units disposed in parallel and having respective outputs, each power supply unit having respective force and sense lines coupled to the DUT; and
   the load circuitry comprises first and second load circuits corresponding to the first and second power supply units and disposed respectively at the power supply unit outputs, the power supply circuit further including switching circuitry operative to selectively place the load circuitry from the second power supply unit in a closed-circuit with the first power supply unit and the force and sense lines from the first and second power supply units.

8. A power supply circuit according to claim 2 wherein the load circuitry further includes:
   validation circuitry disposed within the tester and coupled to the power generation circuitry.

9. A power supply according to claim 8 wherein the internal validation circuitry includes:
   AC load circuitry; and
   capacitive load circuitry.

10. A power supply circuit according to claim 1 wherein the internal load circuitry comprises internal validation circuitry.

11. A power supply circuit according to claim 10 wherein the internal validation circuitry includes:
    AC load circuitry; and
    capacitive load circuitry.

12. A power supply circuit according to claim 10 and further including:
    internal calibration circuitry disposed within the tester and coupled to the power generation circuitry.

13. A power supply according to claim 12 wherein the internal calibration circuitry includes:
    an active DC load.

14. Automatic test equipment for testing a device-under-test, said device-under-test disposed on a device board, the automatic test equipment including:
    a computer workstation;
    a testhead coupled to the computer workstation; and
    a device-under-test power supply, the device-under-test power supply including
       power generation circuitry disposed within the testhead to generate power for the device-under-test; and
       load circuitry disposed within the testhead and coupled to the power generation circuitry, the load circuitry operative to selectively simulate the electrical loading of a device-under-test on the power supply.

15. A method of calibrating an ATE power supply current measurement unit without undocking a semiconductor tester from a device handling apparatus, the device handling apparatus mounting a device-under-test, the ATE power supply current measurement unit being initially coupled to the device-under-test, the method including the steps of:

selecting an in-tester load having a known impedance;

substituting the device-under-test with the in-tester load, such that the ATE power supply current measurement unit is coupled to the in-tester load;

measuring a first current with the current measurement unit;

determining a second current by detecting the voltage across the in-tester load, and dividing the voltage value by the known impedance;

comparing the first current to the second current to calculate an offset current; and assigning calibration values to compensate for the calculated offset current.

16. A method of validating a DUT power supply without undocking a semiconductor tester from a device handling apparatus, the device handling apparatus mounting a device-under-test (DUT), the DUT power supply being initially coupled to the DUT, the method including the steps of:

selecting a dynamic in-tester load having variable dynamic load characteristics;

substituting the device-under-test with the in-tester load, such that the DUT power supply is coupled to the in-tester load;

driving the dynamic in-tester load with the DUT power supply; and confirming that the DUT power supply operated within predetermined performance parameters during the driving step.

17. A method of validating a DUT power supply without undocking a semiconductor tester from a device handling apparatus, the DUT power supply comprising first and second power supply units disposed in parallel, each power supply unit being switchably coupled to the DUT via respective force and sense lines, and each unit having respective first and second in-tester dynamic loads, the method including the steps of:

selecting the first power supply unit for coupling with the DUT;

substituting the in-tester load associated with the second power supply unit for the DUT;

driving the second in-tester load through the respective force and sense lines with the first power supply unit; and confirming that the first power supply unit operated within predetermined performance parameters during the driving step.

* * * * *

UNITED STATES PATENT AND TRADEMARK OFFICE
CERTIFICATE OF CORRECTION

PATENT NO.        : 6,504,395 B1
APPLICATION NO.   : 09/943275
DATED             : January 7, 2003
INVENTOR(S)       : Johnson et al.

It is certified that error appears in the above-identified patent and that said Letters Patent is hereby corrected as shown below:

On the Title Page, Item ((75) should read -- Inventor:  Gerald H. Johnson, Andover, MN (US); Michael F. Taylor, Mpls., MN (US) --.

Signed and Sealed this

Twenty-eighth Day of August, 2007

JON W. DUDAS
*Director of the United States Patent and Trademark Office*